(12) United States Patent
Ding et al.

(10) Patent No.: US 10,186,434 B2
(45) Date of Patent: Jan. 22, 2019

(54) NOZZLE AND ETCHING APPARATUS

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xilong Ding, Beijing (CN); Eryuan Huang, Beijing (CN); Chengsheng Wang, Beijing (CN); Zhaozeng Wu, Beijing (CN); Yubao Zi, Beijing (CN); Zuhong Liu, Beijing (CN)

(73) Assignees: BOE TECHNOLOGY CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/541,428

(22) PCT Filed: Jan. 6, 2017

(86) PCT No.: PCT/CN2017/070397
§ 371 (c)(1),
(2) Date: Jul. 3, 2017

(87) PCT Pub. No.: WO2017/173870
PCT Pub. Date: Oct. 12, 2017

(65) Prior Publication Data
US 2018/0108543 A1  Apr. 19, 2018

(30) Foreign Application Priority Data
Apr. 5, 2016 (CN) .......................... 2016 1 0206567

(51) Int. Cl.
*B05B 1/20* (2006.01)
*H01L 21/67* (2006.01)
*B05B 13/02* (2006.01)

(52) U.S. Cl.
CPC ............ *H01L 21/6708* (2013.01); *B05B 1/20* (2013.01); *B05B 13/0207* (2013.01)

(58) Field of Classification Search
CPC .................................................. H01L 21/6708
See application file for complete search history.

(56) References Cited

U.S. PATENT DOCUMENTS 3,591,082 A * 7/1971 Brenner ................ B05B 1/3033
239/117
3,876,154 A * 4/1975 Griebel ................ B05B 1/3033
239/476

(Continued)

FOREIGN PATENT DOCUMENTS

CN  102151623 A  8/2011
CN  102713001 A  10/2012

(Continued)

OTHER PUBLICATIONS

International Search Report dated Mar. 29, 2017 corresponding to application No. PCT/CN2017/070397.

(Continued)

*Primary Examiner* — Spencer E Bell
(74) *Attorney, Agent, or Firm* — Nath, Goldberg & Meyer; Joshua B. Goldberg; Daniel Bissing

(57) ABSTRACT

A nozzle for use in an etching apparatus and an etching apparatus including the nozzle are provided. The nozzle includes: a hollowed main body having a connector at one end thereof and a main-body outlet at the other end thereof, a main-body connection part being provided at an outer wall of the main body, said one end of the main body being connected with a pipe via the connector and a nozzle sleeve (Continued)

including a nozzle-sleeve connection part and a nozzle-sleeve outlet, the nozzle sleeve being connected to an outer side of said the other end of the main body having the main-body outlet through the nozzle-sleeve connection part and the main-body connection part and the nozzle sleeve is movable relative to the main body in an outflow direction of the main body.

14 Claims, 4 Drawing Sheets

(56) References Cited

U.S. PATENT DOCUMENTS

| | | | | |
|---|---|---|---|---|
| 6,117,778 | A | * 9/2000 | Jones | H01L 21/6708 257/E21.244 |
| 2008/0251107 | A1 | 10/2008 | Osada et al. | |
| 2016/0184839 | A1 | * 6/2016 | Tian | H01L 21/6708 438/745 |
| 2017/0140950 | A1 | * 5/2017 | Li | B05B 15/68 |

FOREIGN PATENT DOCUMENTS

| | | |
|---|---|---|
| CN | 103008299 A | 4/2013 |
| CN | 203513798 U | 4/2014 |
| CN | 104862672 A | 8/2015 |
| CN | 105870040 A | 8/2016 |
| JP | 2008-130643 | 6/2008 |
| JP | 2016-2524 A | 1/2016 |
| KR | 10-2007-0048351 A | 5/2007 |

OTHER PUBLICATIONS

Written Opinion of the International Searching Authority dated Mar. 29, 2017 corresponding to application No. PCT/CN2017/070397.
Office Action dated Dec. 26, 2017 issued in corresponding Chinese Application No. 201610206567.3.

* cited by examiner

NOZZLE AND ETCHING APPARATUS

This is a National Phase Application filed under 35 U.S.C. 371 as a national stage of PCT/CN2017/070397, filed Jan. 6, 2017, an application claiming the benefit of Chinese Application No. 201610206567.3, filed Apr. 5, 2016, the content of each of which is hereby incorporated by reference in its entirety.

FIELD

The present invention belongs to the field of etching technology, and particularly relates to a nozzle for use in an etching apparatus and an etching apparatus having the nozzle.

BACKGROUND

Wet etching is a technique in which a metal layer, which is not covered by a photoresist, on a surface area of a substrate is etched using an etchant, to form desired metal wires. The capability of wet etching directly affects product yield.

When a substrate placed in an etching apparatus is etched through the wet etching process, etchant sprayed on the substrate flows away from periphery of the substrate, such that the replacement rate of the etchant in the peripheral portion of the substrate is high while that in the central portion of the substrate is low (i.e., liquid accumulation effect), resulting in that the periphery of the substrate is etched quickly while the central portion of the substrate is etched slowly (i.e., etching capability is not uniform). As such, it is apt to cause defects such as width of a metal wire is not uniformly distributed, thereby affecting product yield. As the development of large-sized substrate and the increase in thickness of metal film layer, the phenomenon of the non-uniform etching capability due to the liquid accumulation effect is more severe.

SUMMARY

In view of the problem of non-uniform etching capability due to the liquid accumulation effect in an etching process of the prior art, embodiments of the present invention provide a nozzle for use in an etching apparatus and an etching apparatus including the nozzle.

According to an embodiment of the present invention, there is provided a nozzle for use in an etching apparatus, which includes: a hollowed main body having a connector at one end thereof and a main-body outlet at the other end thereof, a main-body connection part being provided at an outer wall of the main body, said one end of the main body being connected with a pipe via the connector; and a nozzle sleeve including a nozzle-sleeve connection part and a nozzle-sleeve outlet, the nozzle sleeve being connected to an outer side of said the other end of the main body having the main-body outlet through the nozzle-sleeve connection part and the main-body connection part; and the nozzle sleeve is movable relative to the main body in an outflow direction of the main body.

Optionally, an outer wall of the main-body connection part and an inner wall of the nozzle-sleeve connection part are provided with screw-threads matching with each other, and the main body and the nozzle sleeve are connected through the screw-threads.

Optionally, the nozzle-sleeve connection part is provided with a pin that is movable in a direction perpendicular to the outflow direction of the main body; and in the outflow direction of the main body, an outer wall of the main-body connection part is provided with a plurality of location holes for accommodating the pin.

Optionally, the main body is provided therein with a filtering structure configured to filter out foreign matters in an etchant.

Optionally, the filtering structure includes a filter net, a filter hole, a macroporous material, or a combination thereof.

Optionally, the nozzle-sleeve outlet is provided with a conduct pipe configured to change an outflow direction of an etchant.

Optionally, the conduct pipe is made of an elastic material.

Optionally, a side of the nozzle-sleeve outlet close to the main body is provided with a rotating shaft penetrated by the conduct pipe.

Optionally, a size of the rotating shaft is larger than a size of the nozzle-sleeve outlet in a direction perpendicular to the outflow direction of the main body, and the rotating shaft drives the conduct pipe to rotate to change the outflow direction of the etchant in the conduct pipe.

Embodiments of the present invention further provide an etching apparatus including the above nozzles and pipes for supplying an etchant, each of the pipes being connected with a plurality of nozzles.

Optionally, a level of the nozzle-sleeve outlet at a middle portion of the pipe is lower than a level of the nozzle-sleeve outlet at a marginal portion of the pipe.

Optionally, the pipes include straight pipes and curved pipes, and the straight pipes are provided at outer sides of the curved pipes.

Optionally, the number of nozzles at a marginal portion of the pipe is less than the number of nozzles at a middle portion of the pipe.

Optionally, a size of the nozzle-sleeve outlet at a marginal portion of the pipe is smaller than a size of the nozzle-sleeve outlet at a middle portion of the pipe.

Optionally, the curved pipe has a certain radian towards a to-be-etched object.

Compared with the prior art, the nozzle and the etching apparatus provided by embodiments of the present invention can reduce, even eliminate, the liquid accumulation effect, such that the etching effect is uniform. The nozzle and the etching apparatus provided by embodiments of the present invention are applicable to various etching processes.

DETAILED DESCRIPTION OF THE EMBODIMENTS

To make those skilled in the art better understand technical solutions of the present invention, the present invention will be described in detail below in conjunction with the accompanying drawings and specific embodiments.

Figure 1:
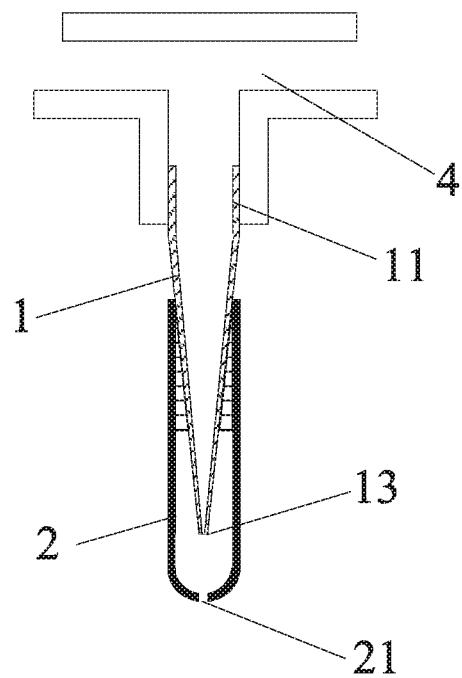
FIG. 1 is a structural schematic diagram of a nozzle according to an embodiment of the present invention.

An embodiment of the present invention provides a nozzle for use in an etching apparatus, and FIG. 1 is a structural schematic diagram of the nozzle according to the embodiment of the present invention. As shown in FIG. 1, the nozzle in the present embodiment includes: a hollowed main body 1 having a connector 11 at one end thereof and a main-body outlet 13 at the other end thereof, a main-body connection part being provided at an outer wall of the main body 1, the one end of the main body 1 being connected with a pipe 4 via the connector 11; and a nozzle sleeve 2 including a nozzle-sleeve connection part and a nozzle-sleeve outlet 21, the nozzle sleeve 2 being connected to an outer side of the other end of the main body 1 having the main-body outlet 13 through the nozzle-sleeve connection part and the main-body connection part. The nozzle sleeve 2 is movable relative to the main body in an outflow direction of the main body.

In practical use, a plurality of nozzles are connected to the pipe 4 into which an etchant is supplied. Because the nozzle sleeve 2 is movable relative to the main body 1, the distances between the nozzle-sleeve outlets 21 corresponding to different positions of a substrate and the substrate may be adjusted, such that the pressure generated when the etchant comes into contact with the substrate can be controlled to reduce, even eliminate, the liquid accumulation effect to render uniform etching effect. For example, an adjustment may be performed such that a distance between the nozzle-sleeve outlet 21 corresponding to a central portion of a to-be-etched substrate and the to-be-etch substrate is smaller than a distance between the nozzle-sleeve outlet 21 corresponding to a marginal portion of the to-be-etched substrate and the to-be-etched substrate.

Next, the specific structure of the nozzle provided by the embodiment of the present invention will be described with reference to FIGS. 2 to 7. As described above, the nozzle in the present embodiment includes: a hollowed main body 1 having a connector 11 at one end thereof and a main-body outlet 13 at the other end thereof, a main-body connection part being provided at an outer wall of the main body 1, the one end of the main body 1 being connected with a pipe 4 via the connector 11; and a nozzle sleeve 2 including a nozzle-sleeve connection part and a nozzle-sleeve outlet 21, the nozzle sleeve 2 being connected, through the nozzle-sleeve connection part and the main-body connection part, to an outer side of the other end of the main body 1 having the main-body outlet 13. The nozzle sleeve 2 is movable relative to the main body 1 in an outflow direction of the main body 1.

Figure 2:
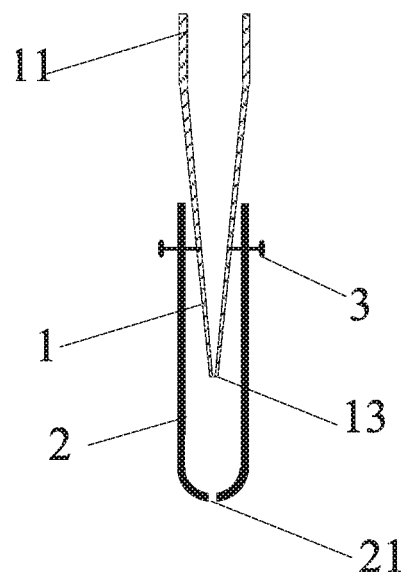
FIG. 2 is a structural schematic diagram of a nozzle according to an embodiment of the present invention.
Figure 3:
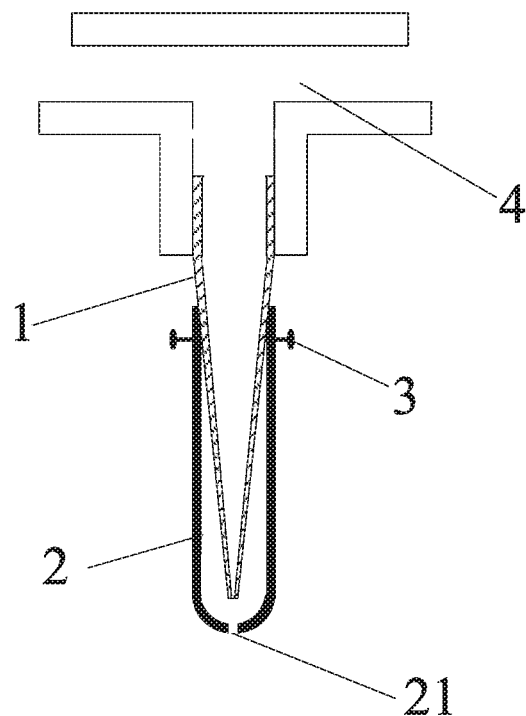
FIG. 3 is a structural schematic diagram of a nozzle according to an embodiment of the present invention.

FIGS. 2 and 3 are schematic diagrams illustrating a connection manner between the main body 1 and the nozzle sleeve 2. As illustrated in FIG. 2, the nozzle-sleeve connection part is provided with a pin 3 that is movable in a direction perpendicular to the outflow direction of the main body 1; and in the outflow direction of the main body 1, an outer wall of the main-body connection part is provided with a plurality of location holes for accommodating the pin 3.

That is to say, the relative position between the main body 1 and the nozzle sleeve 2 can be fixed by the pin 3. In practical use, a distance between the nozzle-sleeve outlet 21 and the substrate can be adjusted by inserting the pin 3 into a corresponding location hole as required. Compared to the case as illustrated in FIG. 3, the distance between the nozzle-sleeve outlet 21 and the substrate is smaller in the case as illustrated in FIG. 2, such that the pressure generated when the etchant comes into contact with the substrate is larger.

Figure 4:
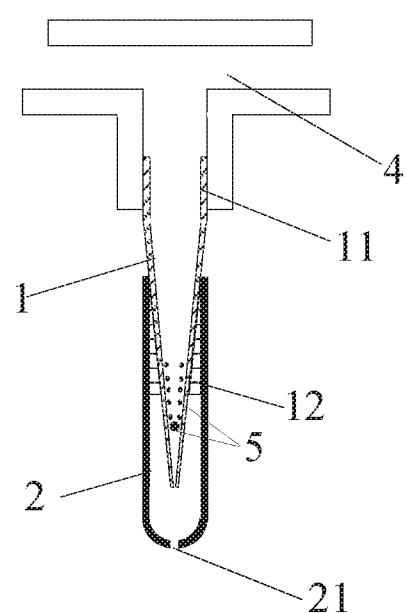
FIG. 4 is a structural schematic diagram of a nozzle according to an embodiment of the present invention.
Figure 5:
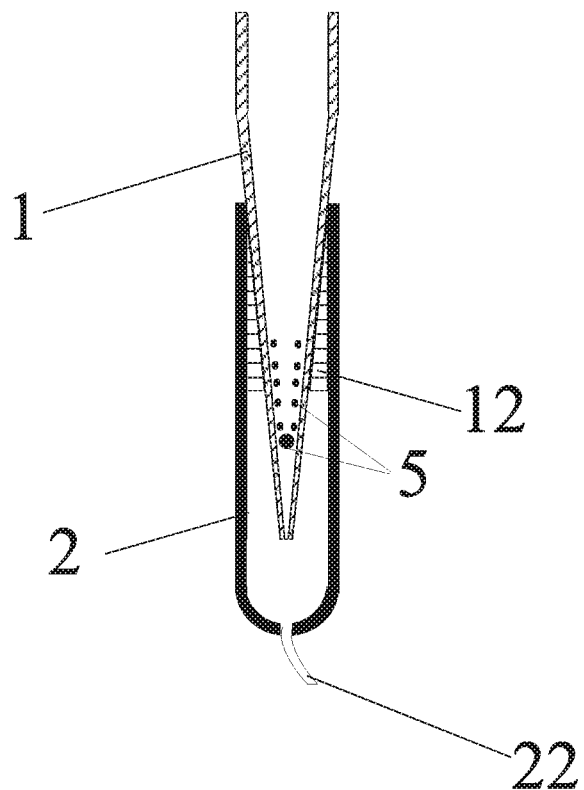
FIG. 5 is a structural schematic diagram of a nozzle according to an embodiment of the present invention.
Figure 7:
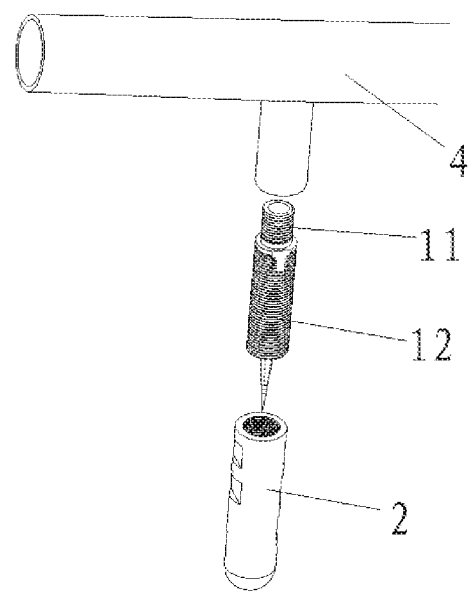
FIG. 7 is a schematic perspective diagram of a nozzle according to an embodiment of the present invention.

FIGS. 4, 5 and 7 illustrate another connection manner between the main body 1 and the nozzle sleeve 2. As illustrated in FIG. 7, an outer wall of the main-body connection part and an inner wall of the nozzle-sleeve connection part are provided with screw-threads 12 matching with each other, and the main body 1 and the nozzle sleeve 2 are connected through the screw-threads 12. In practical use, the screw-threads 12 are aligned and then the nozzle sleeve 2 is screwed up to the main body 1. A depth of the screwed screw-threads may be adjusted, such that distances between the nozzle-sleeve outlets 21 corresponding to different positions of the substrate and the substrate can be set according to needs.

In some embodiments, as shown in FIG. 4, the main body 1 may be provided therein with a filtering structure 5 for filtering out foreign matters in an etchant. For example, the filtering structure 5 may be a filter hole, a filter net, a macroporous material, or a combination thereof.

In some embodiments, as shown in FIG. 5, the nozzle-sleeve outlet 21 may be provided with a rotatable conduct pipe 22 for changing an outflow direction of the etchant. That is to say, not only the pressure generated when the etchant comes into contact with the substrate can be adjusted, but also the outflow direction of the nozzle-sleeve outlet 21 can be rotationally adjusted to a predetermined direction by using the conduct pipe 22 which is rotatable. Optionally, the conduct pipe 22 is made of an elastic material.

Figure 6:
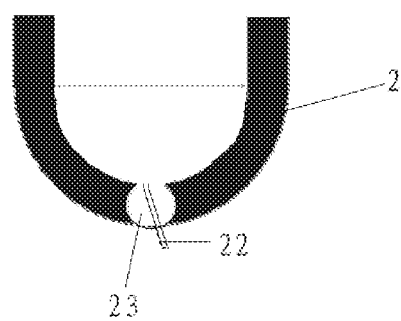
FIG. 6 is a structural schematic diagram of a nozzle according to an embodiment of the present invention.

In some embodiments, as shown in FIG. 6, a side of the nozzle-sleeve outlet 21 close to the main body 1 is provided with a rotating shaft 23 penetrated by the conduct pipe 22. Specifically, a size of the rotating shaft 23 is larger than a size of the nozzle-sleeve outlet 21 in a direction perpendicular to the outflow direction of the main body 1, and the rotating shaft 23 drives the conduct pipe 22 to rotate to change the outflow direction of the etchant in the conduct pipe 21. That is, with the rotating shaft 23, the etchant is guided to a predetermined direction.

Figure 8:
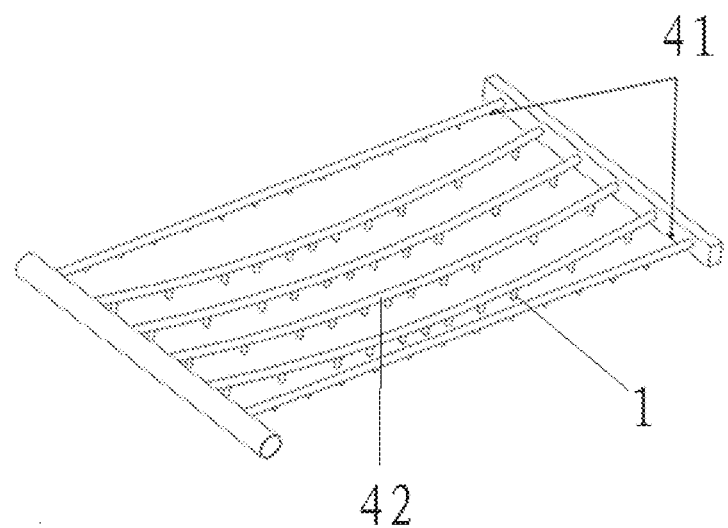
FIG. 8 is a structural schematic diagram of an etching apparatus according to an embodiment of the present invention.
Figure 9:
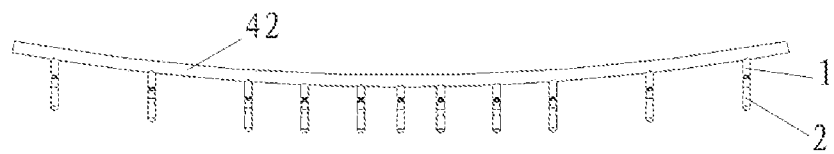
FIG. 9 is a partial structural schematic diagram of an etching apparatus according to the embodiment of the present invention.

Embodiments of the present invention further provide an etching apparatus. FIG. 8 is a structural schematic diagram of an etching apparatus according to an embodiment of the present invention. FIG. 9 is a partial structural schematic diagram of an etching apparatus according to the embodiment of the present invention. As shown in FIGS. 8 and 9, the etching apparatus in the present embodiment includes the above nozzles and pipes 4 for supplying etchant.

Optionally, as shown in FIG. 8, the pipes 4 may include straight pipes 41 and curved pipes 42, and the straight pipes 41 are provided at outer sides of the curved pipes 42. For example, the curved pipe has a certain radian towards a to-be-etched substrate.

Optionally, as shown in FIG. 9, a level of a nozzle-sleeve outlet 21 at the middle portion of the pipe 4 may be lower than a level of a nozzle-sleeve outlet 21 at the marginal portion of the pipe 4. That is, the nozzle-sleeve outlet 21 at the middle portion of the pipe has a smaller distance from the to-be-etched substrate.

Optionally, as shown in FIGS. 8 and 9, the number of nozzles at the marginal portion of the pipe is less than the number of nozzles at the middle portion of the pipe. That is, the nozzles at the middle portion of the pipe are provided denser.

According to this design, in addition to that the pressures generated when the etchant comes into contact with the substrate at different positions can be adjusted, the outflow volume of the etchant corresponding to the central portion of the substrate and that corresponding to the marginal portion of the substrate can also be adjusted, thereby further abating, even eliminating, the liquid accumulation effect.

Needless to say, various modifications may be made to specific implementations of the above embodiments. For example, the nozzle-sleeve outlets having different dimensions may be provided, such that the outflow volumes of the etchant corresponding to different positions of the substrate can be controlled. For example, a size of the nozzle-sleeve outlet corresponding to a marginal portion of the substrate may be made smaller than that corresponding to a central portion of the substrate, thereby further abating, even eliminating, the liquid accumulation effect.

It could be understood that the foregoing implementations are merely exemplary embodiments used for describing the principle of the present invention, but the present invention is not limited thereto. Those of ordinary skill in the art may make various variations and improvements without departing from the spirit and essence of the present invention, and these variations and improvements shall also fall into the protection scope of the present invention.

What is claimed is:

1. A nozzle for use in an etching apparatus, comprising:
   a hollowed main body having a connector at one end thereof and a main-body outlet at the other end thereof, a main-body connection part being provided at an outer wall of the main body, and said one end of the main body being connected with a pipe via the connector; and
   a nozzle sleeve comprising a nozzle-sleeve connection part and a nozzle-sleeve outlet, the nozzle sleeve being connected to an outer side of said the other end of the main body having the main-body outlet through the nozzle-sleeve connection part and the main-body connection part;
   wherein the nozzle sleeve is movable relative to the main body in an outflow direction of the main body,
   wherein the nozzle-sleeve outlet is provided with a conduit pipe configured to change an outflow direction of an etchant, and the conduit pipe is configured to extend from a bottom of the nozzle sleeve in a direction away from the nozzle sleeve.

2. The nozzle according to claim 1, wherein an outer wall of the main-body connection part and an inner wall of the nozzle-sleeve connection part are provided with screw-threads matching with each other, and the main body and the nozzle sleeve are connected through the screw-threads.

3. The nozzle according to claim 1, wherein the nozzle-sleeve connection part is provided with a pin that is movable in a direction perpendicular to the outflow direction of the main body; and in the outflow direction of the main body, an outer wall of the main-body connection part is provided with a plurality of location holes for accommodating the pin.

4. The nozzle according to claim 1, wherein the main body is provided therein with a filtering structure configured to filter out foreign matters in an etchant.

5. The nozzle according to claim 4, wherein the filtering structure includes a filter net, a filter hole, a macroporous material, or a combination thereof.

6. The nozzle according to claim 1, wherein the pipe is made of an elastic material.

7. The nozzle according to claim 1, wherein a rotating shaft is provided at the nozzle-sleeve, and the conduit pipe is provided in the rotating shaft.

8. The nozzle according to claim 7, wherein a size of the rotating shaft is larger than a size of the nozzle-sleeve outlet in a direction perpendicular to the outflow direction of the main body, and the rotating shaft drives the conduit pipe to rotate to change the outflow direction of the etchant in the conduit pipe.

9. An etching apparatus, comprising nozzles according to claim 1 and pipes for supplying the etchant, each of the pipes being connected with a plurality of nozzles.

10. The etching apparatus according to claim 9, wherein a level of the nozzle-sleeve outlet at a middle portion of the pipe is lower than a level of the nozzle-sleeve outlet at a marginal portion of the pipe.

11. The etching apparatus according to claim 9, wherein the pipes comprise straight pipes and curved pipes, and the straight pipes are provided at outer sides of the curved pipes.

12. The etching apparatus according to claim 11, wherein the curved pipe has a certain radian towards a to-be-etched object.

13. The etching apparatus according to claim 9, wherein of nozzles at a marginal portion of the pipe is less than a density of nozzles at a middle portion of the pipe.

14. The etching apparatus according to claim 9, wherein a size of the nozzle-sleeve outlet at a marginal portion of the pipe is smaller than a size of the nozzle-sleeve outlet at a middle portion of the pipe.

* * * * *